(12) United States Patent
Sadamitsu et al.

(10) Patent No.: US 7,316,745 B2
(45) Date of Patent: Jan. 8, 2008

(54) HIGH-RESISTANCE SILICON WAFER AND PROCESS FOR PRODUCING THE SAME

(75) Inventors: Shinsuke Sadamitsu, Tokyo (JP); Nobumitsu Takase, Tokyo (JP); Hiroyuki Takao, Tokyo (JP); Koji Sueoka, Tokyo (JP); Masataka Horai, Tokyo (JP)

(73) Assignee: Sumco Corporation, Tokyo (JP)

( * ) Notice: Subject to any disclaimer, the term of this patent is extended or adjusted under 35 U.S.C. 154(b) by 37 days.

(21) Appl. No.: 10/519,837

(22) PCT Filed: Jun. 30, 2003

(86) PCT No.: PCT/JP03/08333

§ 371 (c)(1),
(2), (4) Date: Jul. 5, 2005

(87) PCT Pub. No.: WO2004/008521

PCT Pub. Date: Jan. 22, 2004

(65) Prior Publication Data

US 2005/0250349 A1    Nov. 10, 2005

(30) Foreign Application Priority Data

Jul. 17, 2002 (JP) .............................. 2002-208515

(51) Int. Cl.
*C30B 29/06* (2006.01)
*H01L 21/322* (2006.01)
*H01L 21/324* (2006.01)

(52) U.S. Cl. .................... 117/20; 117/2; 428/64.1; 428/446

(58) Field of Classification Search ................. 117/13, 117/20, 932, 931, 2; 428/446, 64.1
See application file for complete search history.

(56) References Cited

U.S. PATENT DOCUMENTS 5,502,331 A * 3/1996 Inoue et al. ............... 257/617

(Continued)

FOREIGN PATENT DOCUMENTS

| EP | 1087041 | 3/2001 |
| JP | 5-144827 | 6/1993 |
| JP | 2004-6615 A * | 1/2004 |

OTHER PUBLICATIONS

Babich, V.M. et al., 'Generation of thermal donors as a result of one- and two-step annealing of silicon crystals with large and small carbon concentrations', Semiconductors, vol. 30, No. 5, pp. 417 to 419, May 1996.

(Continued)

*Primary Examiner*—M. Wilczewski
(74) *Attorney, Agent, or Firm*—Oblon, Spivak, McClelland, Maier & Neustadt, P.C.

(57) ABSTRACT

A high-resistance silicon wafer is manufactured, in which a gettering ability and economical efficiency is excellent and an oxygen thermal donor is effectively prevented from being generated in a heat treatment for forming a circuit, which is to be implemented on the side of a device manufacturer. In order to implement the above, a high-temperature heat treatment at 1100° C. or higher is performed on a carbon doped high-resistance and high-oxygen silicon wafer in which specific resistivity is 100 Ωcm or more and a carbon concentration is $5\times10^{15}$ to $5\times10^{17}$ atoms/cm$^3$ so that a remaining oxygen concentration becomes $6.5\times10^{17}$ atoms/cm$^3$ or more (Old-ASTM). As this high-temperature treatment, an OD treatment for forming a DZ layer on a wafer surface, a high-temperature annealing treatment for eliminating a COP on the surface layer, a high-temperature heat treatment for forming a BOX layer in a SIMOX wafer manufacturing process and the like can be used.

15 Claims, 8 Drawing Sheets

U.S. PATENT DOCUMENTS

| | | | |
|---|---|---|---|
| 6,277,201 B1* | 8/2001 | Nishikawa | 118/726 |
| 6,544,656 B1* | 4/2003 | Abe et al. | 428/446 |
| 6,905,771 B2* | 6/2005 | Ono et al. | 428/446 |
| 2003/0192469 A1* | 10/2003 | Libbert et al. | 117/2 |
| 2005/0103256 A1* | 5/2005 | Sadamitsu et al. | 117/20 |
| 2005/0253221 A1* | 11/2005 | Takase et al. | 257/607 |
| 2006/0266278 A1* | 11/2006 | Ono et al. | 117/19 |
| 2007/0066033 A1* | 3/2007 | Kurita et al. | 438/473 |
| 2007/0105279 A1* | 5/2007 | Falster et al. | 438/113 |

OTHER PUBLICATIONS

Kodate, Junichi et al., Suppression of Substrate Crosstalk in Mixed-Signal Complementary MOS Circuits Using High-Resistivity SIMOX (Separation by IMplanted OXygen) Wafers, Japanese Journal of Applied Physics, Part 1, vol. 39, No. 4B, pp. 2256 to 2260, Apr. 2000.

Wijaranakula, W. et al., 'A Formation of Crystal Defects in Carbon-Doped Czochralski-Grown Silicon after a Three-Step Internal Gettering Anneal', Journal of Electrochemical Society, vol. 138, No. 7, pp. 2153 to 2159, Jul. 1991.

Gaworzewski P. et al., 'Oxygen-Related Donors Formed at 600° C in Silicon in Dependence on Oxygen and Carbon Content', Phys. Stat.Sol. (a), vol. 77, No. 2, pp. 571 to 582, 1983.

* cited by examiner

HIGH-RESISTANCE SILICON WAFER AND PROCESS FOR PRODUCING THE SAME

TECHNICAL FIELD

The present invention relates to a high-resistance silicon wafer used in a support substrate and the like in a high-frequency communication device or an analog-digital device and its manufacturing method.

BACKGROUND ART

Recently, a demand for high-resistance substrate is increased along with the widespread use of a high-frequency communication device used in a short-distance wireless LAN. Conventionally, a compound semiconductor substrate such as GaAs has been mainly used as a support substrate of a RF (Radio Frequency: high frequency) circuit which requires high resistance. However, the compound semiconductor substrate is very expensive.

Meanwhile, a silicon CMOS requires a large amount of power, so that it has been considered that it is not suitable for the RF circuit. However, because of recent considerable miniaturization and development of designing, it can be applied to the RF circuit. Therefore, a high-resistance silicon wafer which is excellent in RF characteristics and excellent in economical efficiency such as a mirror-surface silicon wafer and a SOI (Silicon On Insulator) wafer using high-resistance crystal grown by the Czochralski method (CZ method) has attracted a lot of attention instead of the substrate of the compound semiconductor such as GaAs.

In addition, there is a demand for improvement of a substrate resistance to noise in an analog-digital device and in this view also there is a demand for a high-resistance silicon wafer.

However, since a quartz crucible is used when a silicon single crystal is manufactured by the CZ method, oxygen is contained in the crystal in an oversaturated state. Since an oxygen donor such as a thermal donor (TD) and a new donor (ND) is formed from this oxygen in a heat treatment in the process of forming a circuit of the device, there is a big problem such that resistivity of the wafer unstably varies on the side of a device manufacturer.

Figure 1:
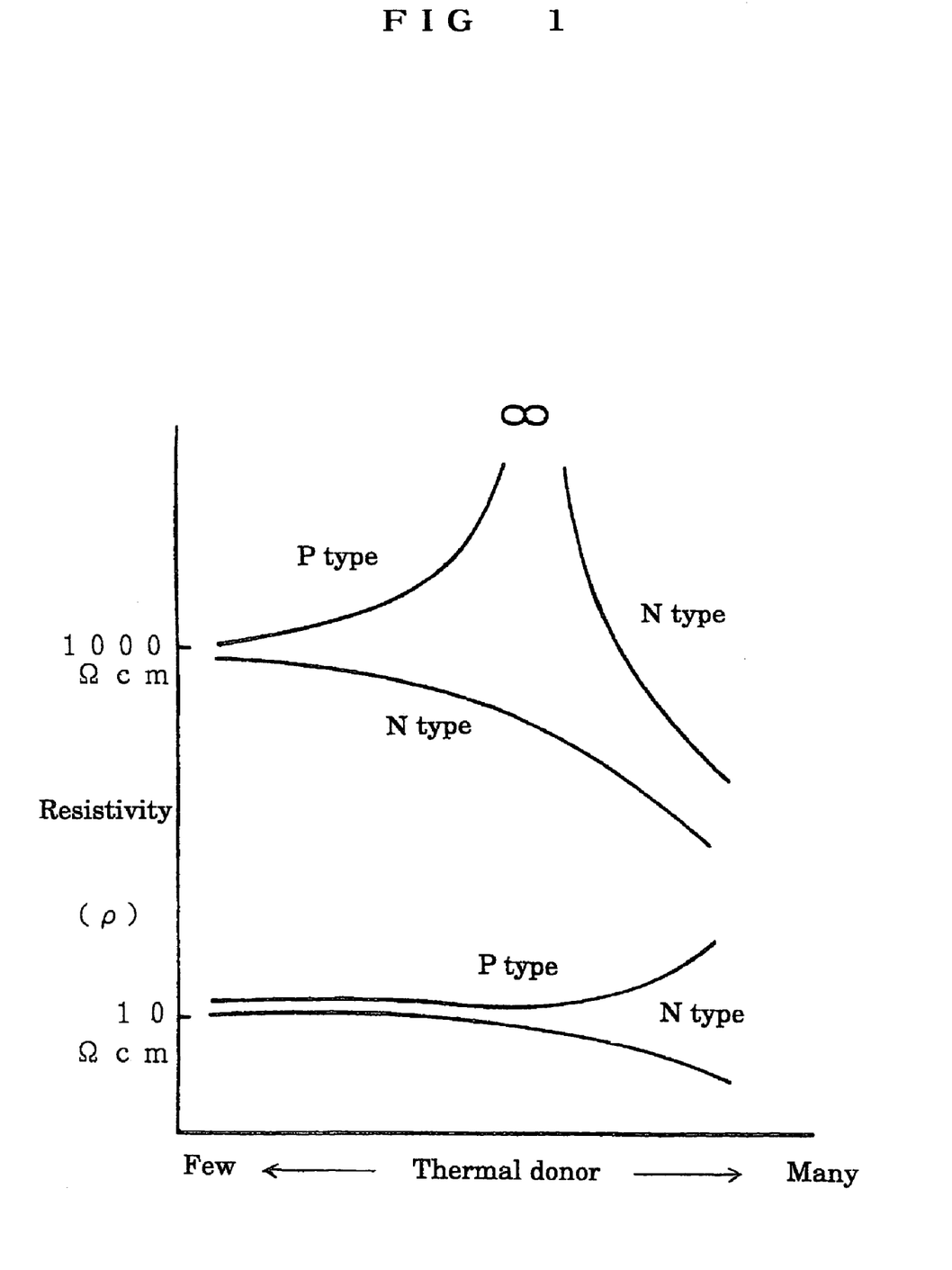
FIG. 1 is a graph showing an influence of an oxygen donor on resistivity of a wafer.

FIG. 1 is a graph showing a relation between the oxygen donor and the wafer resistivity. In a case of the normal low-resistance wafer to which a dopant is added, since the oxygen donor slightly affects the resistivity of the wafer, there is no problem in a real operation. However, in a case of the high-resistance wafer in which the dopant is limited, when it is an n type, the resistivity is considerably reduced as the oxygen donor is increased. When it is a p type, although the resistivity is considerably increased along with the increase of the oxygen donor at first, if the oxygen donor is kept increasing, the p type is converted to the n type, so that the resistivity is considerably decreased.

In order to solve the above problem such that the resistivity considerably varies along with the increase of the oxygen donor, there is taken measures to prevent the oxygen donor from being formed by using a low-oxygen silicon wafer which is manufactured using a special crucible in which oxygen is prevented from being fused by a MCZ method or an inner face SiC coating. However, the low-oxygen silicon wafer which needs to use the MCZ method or the special crucible is surely expensive as compared with the general-purpose silicon wafer having a relatively high oxygen concentration which is manufactured by the normal CZ method. In addition, the oxygen lowering has a technical limitation. That is, in general, it is considered that concentration of $6\times10^{17}$ atoms/cm$^3$ or less is difficult to be implemented and a degree of $8\times10^{17}$ atoms/cm$^3$ is a limit in a wafer of 300 mm. In addition, in the silicon wafer having a low oxygen concentration, there is a problem of slipping and the like because of the lowering of mechanical strength caused by reduction in oxygen concentration.

In order to solve the above problem, International Publication WO 00/55397 pamphlet discloses a technique in which a silicon single crystal rod having resistivity of 100 Ωcm or more and initial interstitial oxygen concentration of 10 to 25 ppma [JEIDA] (7.9 to $19.8\times10^{17}$ atoms/cm$^3$ [Old-ASTM]) is grown, and a heat treatment for oxygen precipitation is performed on a silicon wafer cut from the above rod so as to limit the remaining interstitial oxygen concentration in the wafer to 8 ppma [JEIDA] ($6.4\times10^{17}$ atoms/cm$^3$ [Old-ASTM]) or less.

According to this technique, the manufacturing cost of the initial wafer becomes low because the general-purpose silicon wafer having a high initial oxygen concentration is used. Although the general-purpose silicon wafer having the high initial oxygen concentration is used, since the oxygen precipitating heat treatment is performed on the silicon wafer, the remaining oxygen concentration is lowered. Therefore, an oxygen donor is effectively prevented from being generated in a heat treatment for forming a circuit which is to be performed on the side of a device manufacturer. In the process of lowering the oxygen concentration in the wafer, a large amount of oxygen precipitate (BMD) is generated. Therefore, a gettering ability of the wafer is improved.

However, according to the technique disclosed in the International Publication WO 00/55397 pamphlet, it is necessary to generate the large amount of oxygen precipitate (BMD) using a high-resistance primary substrate having a high-oxygen concentration, and to sufficiently lower the remaining oxygen concentration of a product silicon wafer because of generation of the large amount of oxygen precipitate (BMD). However, this causes the following problems.

First, to lower the remaining oxygen concentration in the product silicon wafer causes the mechanical strength of the wafer to be lowered. This is clear from the fact that slip dislocation generated from a wafer supporting part in the heat treatment is fixed by oxygen and as a result, a slip length is lowered as the oxygen concentration is increased [M. Akatsuka et al., Jpn. J. Appl. Phys., 36 (1997) L1422]. Meanwhile, the oxygen precipitate (BMD) is a factor of affecting the strength. The influence of BMD to the strength is complicated. For example, when the heat and stress of one's own weight added to the wafer is not so large, the movement of the slip dislocation is prevented and the strength is improved (International Publication WO 00/55397), but when the heat and the stress of one's own weight is large, the BMD itself becomes a source of the slip dislocation, so that the strength is lowered and the wafer is probably warped (K. Sueoka et al., Jpn. J. Appl. Phys., 36 (1997) 7095). The heat and the stress of one's weight applied to the wafer in the real device process depend on a device structure or a thermal sequence, and it is expected to be increased in some cases. Therefore, in view of maintaining the mechanical strength of the wafer, if the BMD required for gettering is provided, the considerable lowering of the remaining oxygen by the excessive BMD generation described in the International Publication WO 00/55397 is not preferable.

The second problem is a heat treatment cost. That is, in order to generate a large amount of oxygen precipitate, the heat treatment for forming the oxygen precipitate nucleus and the heat treatment for growing the oxygen precipitate at a high temperature for a long time are needed. Therefore, the heat treatment cost is increased. As a result, although the manufacturing cost of the primary wafer is inexpensive, a price of a final product wafer becomes expensive.

It is an object of the present invention to provide the high-resistance silicon wafer in which a gettering ability and economical efficiency is excellent, the oxygen donor is effectively prevented from being generated in the heat treatment for forming the circuit which is to be implemented on the side of the device manufacturer, and mechanical strength is high, and its manufacturing method.

DISCLOSURE OF INVENTION

In order to attain the above objects, the inventors of the present invention have determined that a cause of the above problems lies in the excessive generation of the oxygen precipitate (BMD) and the considerable lowering of the remaining oxygen concentration in the product wafer caused by the excessive generation thereof, and studied about measures for preventing the generation of oxygen donor instead of the generation of the oxygen precipitate (BMD) in the high-resistance silicon wafer. As a result, they discovered that carbon doping is effective in preventing generation of the oxygen donor, especially in preventing generation of the thermal donor, and when a heat treatment is performed in addition to the carbon doping, the generation of the oxygen donor such as the thermal donor and a new donor is more effectively prevented, and many existing heat treatments which are generally used in a process of manufacturing various kinds of wafers such as a DZ wafer, a hydrogen annealed wafer, a SIMOX type and a bonded type of SOI wafer can be used as the heat treatment which is effective in preventing the generation of the oxygen donor.

The fact that the carbon doping is effective in preventing the generation of the oxygen thermal donor is well known in a wafer having a normal resistance in which resistivity is less than 100 Ω (for example, refer to A. B. Bean and R. C. Newman J. Phycs. Chem. Solids, 1972, Vol. 33, pp. 255-268). However, in order to prevent the generation of the oxygen thermal donor in the wafer having the normal resistance, a carbon amount needs to be $1 \times 10^{18}$ atoms/cm$^3$. Since such carbon doping at high concentration accelerates dislocation in the growth of the single crystal by the CZ method and its crystallization becomes difficult, it is not realistic measures. However, it has become clear that in a high-resistance wafer having resistivity 100 Ω or more, an amount of carbon needed for preventing the generation of the oxygen thermal donor can be lowered to a realistic level such as $5 \times 10^{15}$ to $5 \times 10^{17}$ atoms/cm$^3$ which does not hinder the single crystal crystallization.

Thus, since the appropriate amount of carbon doping in the high-resistance wafer can effectively prevent the generation of the oxygen donor in the heat treatment for forming the circuits which is to be implemented on the side of the device manufacturer, it becomes unnecessary to excessively generate the oxygen precipitate (BMD), so that the heat treatment cost can be lowered. In addition, it is not necessary to considerably lower the remaining oxygen concentration in the product wafer, so that the mechanical strength of the wafer can be improved. Furthermore, as described in a document (M. Akatsuka and K. Sueoka, Jpn. J. Appln. Phys., 40 (2001) 1240), further improvement in mechanical strength can be implemented by the appropriate amount of carbon doping. In addition, since generation of dislocation cluster when the single crystal is grown can be prevented by the carbon doping, non-defect crystal region in the growth of the single crystal can be expected to be enlarged.

The reason why the carbon doping is effective in preventing the generation of the oxygen thermal donor is thought as follows. In addition, the reason why the doping amount of carbon can be reduced in the high-resistance wafer is thought as follows. Still further, the reason why the generation of the oxygen donor is prevented by the heat treatment of the carbon doped wafer is thought as follows.

Although the reason why the carbon doping is effective in preventing the generation of the oxygen thermal donor is not completely figured out, according to A. B. Bean and R. C. Newman J. Phycs. Chem. Solids, 1972, Vol. 33, pp. 255-268, for example, the reason is thought as follows. That is, the oxygen thermal donor is an On cluster in which 4 to 20 oxygen atoms are collected and it is generated at 400 to 500° C. When a carbon atom exists at an early stage of generation of such cluster, the carbon is captured by $O_2$ cluster which is a precursor to an electrically inactive thermal donor and C—$O_2$ cluster is generated. Therefore, subsequent generation of the electrically active On (n≧4) can be prevented.

In addition, in the silicon wafer having a normal resistance such as several Ωcm to several tens of Ωcm, it is necessary to generate the thermal donor of $10^{14}$ to $10^{16}$ atoms/cm$^3$ in order to detect the generation of the oxygen thermal donor by variation of resistivity, and a high-concentration carbon such as $1 \times 10^{18}$ atoms/cm$^3$ is needed in order to prevent the generation of the thermal donor having such density. However, in the case of the high-resistance silicon wafer having resistance of 100 Ω or more, since resistivity is varied by the generation of the oxygen donor of $10^{14}$ atoms/cm$^3$ or less, the carbon doping amount to prevent this generation can be reduced to $5 \times 10^{15}$ to $5 \times 10^{17}$ atoms/cm$^3$.

In addition, it was found that when a heat treatment at 1100° C. or more was performed on the high-resistance silicon wafer having resistance of 100 Ω or more in which carbon was doped, the generation of the oxygen donor could be effectively prevented. Although the reason why the generation of the oxygen donor is prevented by the heat treatment at 1100° C. or higher and carbon doping is not clear at present, it is thought that the thermal donor which is a relatively small oxygen cluster and the new donor which is regarded as an initial form of the oxygen precipitate which is generated in the heat treatment at 600 to 700° C. are grown, or decomposed and inactivated in the heat treatment at 1100° C. or higher.

The high-resistance silicon wafer of the present invention is completed based on the above knowledge and it is a CZ silicon wafer having resistivity 100 Ω or more, in which a carbon concentration is $5 \times 10^{15}$ to $5 \times 10^{17}$ atoms/cm$^3$.

In addition, according to a manufacturing method of the high-resistance silicon wafer of the present invention, a heat treatment which is effective in preventing the generation of the oxygen donor, and preferably a high-temperature heat treatment at 1100° C. or higher is performed on the silicon wafer having the resistivity of 100 Ω or more and a carbon concentration of $5 \times 10^{15}$ to $5 \times 10^{18}$ atoms/cm$^3$.

Since the carbon concentration in the high-resistance silicon wafer according to the present invention is $5 \times 10^{15}$ to $5 \times 10^{17}$ atoms/cm$^3$, the generation of the oxygen thermal donor can be prevented while the remaining oxygen concentration is maintained at high level, and the mechanical strength and the slipping resistance of the wafer can be improved by the high-concentration remaining oxygen and the carbon doping. In addition, excellent gettering ability can be provided by the generation of an appropriate amount of oxygen precipitate (BMD) which is not influenced by the remaining oxygen concentration.

When the carbon concentration in the wafer is less than $5 \times 10^{15}$ atoms/cm$^3$, the effect in preventing the generation of the oxygen donor is not sufficient. Meanwhile, when it is more than $5 \times 10^{17}$ atoms/cm$^3$, dislocation could occur while the crystal is grown and single crystal crystallization becomes difficult. An especially preferable carbon concentration is $5 \times 10^{15}$ to $3 \times 10^{17}$ atoms/cm$^3$.

The preferable remaining oxygen concentration in the wafer is $6.5 \times 10^{17}$ atoms/cm$^3$ (Old-ASTM) or more. When this is less than $6.5 \times 10^{17}$ atoms/cm$^3$, the mechanical strength is lowered. Although an upper limit of the remaining oxygen concentration is not especially defined, it is preferably $25 \times 10^{17}$ atoms/cm$^3$ or less in view of concern of defect generation on the substrate surface because of excessive oxygen precipitate depending on a device heat treatment condition which is to be implemented on the side of the user because the oxygen precipitate is increased as the oxygen concentration is increased, or a limit of an initial oxygen concentration as will be described below. According to an especially preferable remaining oxygen concentration, its lower limit is beyond $8 \times 10^{17}$ atoms/cm$^3$ and its upper limit is $20 \times 10^{17}$ atoms/cm$^3$ or less and more preferably, $16 \times 10^{17}$ atoms/cm$^3$ or less.

The high-resistance silicon wafer of the present invention can be any type. The type will be illustrated below.

1̂ Although it is thought that an appropriate amount of oxygen precipitate is effective in providing the gettering ability in the high-resistance silicon wafer of the present invention, the oxygen precipitate could become a harmful defect in the device formation on the other hand and especially the oxygen precipitate existing on the surface layer of the wafer causes deterioration of the device characteristics. Therefore, it is desirable that the oxygen precipitate is eliminated from the surface layer of the wafer at least. In this respect, the present invention can be applied to a DZ wafer on which DZ (Denuded Zone) is formed in depth of at least 5 μm or more from a wafer surface.

The DZ layer can be formed by OD (Oxygen Out-Diffusion) treatment. The OD treatment is preferably performed at 1100 to 1350° C. for 1 to 5 hours. Since the OD treatment is performed at high temperature such as 1100° C. or higher, it can be used also as the heat treatment which is effective in preventing the generation of the oxygen donor. In addition, by selecting a gas atmosphere in the OD treatment, a grown-in defect such as COP (Crystal Originated Particle: holes which are a void defect surrounded by (111) surface) can be eliminated from the wafer surface layer.

That is, as the gas atmosphere in the OD treatment, there are nitrogen gas, oxygen gas, hydrogen gas, argon gas and the like. The COP can be eliminated from the wafer surface layer in the atmosphere of the hydrogen gas, the argon gas and the mixture of these gas among the above OD treatment atmosphere. This is an effective processing for a wafer which is not free of the COP.

For reference, the DZ layer is formed such that after a heat treatment at 1000° C. for 16 hours in a dry oxygen atmosphere, a wafer is cleaved and a wafer cleaved face is etched away by 2 μm with a selected etching solution (HF:HNO$_3$:CrO$_3$:Cu(NO$_3$)$_2$:H$_2$O:CH$_3$COOH=1200 cc:600 cc:250 g:40 g:1700 cc:1200 cc). Then, it is defined by a distance from the wafer surface to a first etch pit by an optical microscope.

2̂ There is a high-speed temperature rising and falling RTA (Rapid Thermal Anneal) treatment called lamp anneal treatment also as a heat treatment which is similar to the OD treatment. The present invention is effective in the wafer which receives this treatment and the treatment can be used also as the heat treatment which is effective in preventing the generation of the oxygen donor.

3̂ Apart from the above heat treatment, an IG (Intrinsic Getterring) treatment which aggressively forms the oxygen precipitate is performed in some cases in order to provide the gettering ability. Although the IG treatment is a heat treatment for forming the oxygen precipitate nucleus, a heat treatment for growing an oxygen precipitate is performed subsequently in some cases. Since the heat treatment for growing the oxygen precipitate is a heat treatment for consuming oxygen in the wafer as the oxygen precipitate is grown, it is effective in preventing the generation of the oxygen donor. However, it is necessary to note that the oxygen concentration in the wafer is not lowered to $6.5 \times 10^{17}$ atoms/cm$^3$ or less.

4̂ From the same viewpoint, the present invention is effective in an epitaxial wafer in which an epitaxial layer is formed on a wafer surface. In manufacturing the epitaxial wafer, a hydrogen baking treatment at 1100° C. or more is performed prior to an epitaxial growing treatment at about 1100° C. These heat treatments can be used also as the heat treatment which is effective in preventing the generation of the oxygen donor.

5̂ From the same viewpoint, the present invention is effective in a base wafer of an SOI wafer. The SOI wafer may be either a bonded type or an SIMOX type. In manufacturing the bonded type of wafer, a high-temperature heat treatment at 1100° C. or more is performed in a step of bonding the wafer. This high-temperature heat treatment can be used also as the heat treatment which is effective in preventing the generation of the oxygen donor. Meanwhile, in manufacturing the SIMOX type, a high-temperature heat treatment at 1100° C. or higher is performed in order to form a BOX layer after oxygen ion injection. This high-temperature heat treatment can be used also as the heat treatment which is effective in preventing the generation of the oxygen donor.

6̂ Although defect distribution of the wafer in the thickness direction of the wafer was focused on in the above, the wafer can be classified by defect distribution in the diameter direction of the wafer. The present invention can be effective in a normal wafer in which the COP exists at least in a part in the diameter direction as well as a wafer free of the COP, which is provided from a defect-free crystal in which the Grown-in defect such as a large-sized COP or dislocation cluster is eliminated from an entire region in the crystal diameter direction by an operation and the like in a crystal pulling process.

7̂ Referring to the COP-free wafer, although it was described in the OD treatment, the present invention can be effective in not only the COP-free wafer provided from the defect-free crystal but also a COP-free annealed wafer in which the COP is eliminated from a surface layer by a heat treatment at 1100° C. for 1 hour in the non-oxidizing gas atmosphere.

This annealing can be used also as the heat treatment which is effective in preventing the generation of the oxygen donor. In addition, the COP-free wafer means a state in which a density of LPD (Light Point Defect) having a size 0.12 μm or more and observed on the wafer surface is controlled so as to be 0.2/cm$^2$ or less.

According to the manufacturing method of the high-resistance silicon wafer of the present invention, since the carbon concentration in the wafer is $5 \times 10^{15}$ to $5 \times 10^{17}$ atoms/cm$^3$, the oxygen donor, especially the thermal donor can be effectively prevented from being generated while the remaining oxygen concentration is maintained at high level. In addition, when the heat treatment at 1100° C. or higher is performed in addition to the carbon doping, not only the thermal donor but also the new donor can be effectively prevented from being generated, so that the resistivity can be stabilized by both of them.

The initial oxygen concentration (oxygen concentration before the heat treatment) in the silicon wafer is selected from a range such that the remaining oxygen concentration becomes $6.5 \times 10^{17}$ atoms/cm$^3$ or more (Old-ASTM) in view of the generation amount of the BMD. Quantitatively, considering that there is a case where the BMD is not generated, it is preferably beyond $8 \times 10^{17}$ atoms/cm$^3$, and more preferably $10 \times 10^{17}$ atoms/cm$^3$ or more. According to an upper limit of the initial oxygen concentration, in view of solid solution limit of oxygen and excessive oxygen precipitate as will be described below, it is preferably $25 \times 10^{17}$ atoms/cm$^3$ or less, and more preferably $20 \times 10^{17}$ atoms/cm$^3$ or less, and further preferably $18 \times 10^{17}$ atoms/cm$^3$ or less. When the oxygen concentration is extremely high, since the oxygen precipitate is excessively generated, a secondary defect such as a defect in the oxygen precipitate or in a laminated layer or dislocation is generated in a device active layer of the wafer surface layer, which deteriorates the device characteristics. However, since the oxygen precipitation treatment is not performed in some cases, the upper limit can be allowed to be until $25 \times 10^{17}$ atoms/cm$^3$.

The remaining oxygen concentration after the heat treatment is preferably not less than $6.5 \times 10^{17}$ atoms/cm$^3$ and not more than $25 \times 10^{17}$ atoms/cm$^3$ (Old-ASTM) for the reason described above. In this case also, since some users do not care about the oxygen precipitate, the upper limit is allowed to be until $25 \times 10^{17}$ atoms/cm$^3$.

The CZ silicon wafer receives various kinds of heat treatments which is peculiar to its type. These existing heat treatments such as the oxygen out-diffusion heat treatment, the RTA treatment, the SIMOX heat treatment, the bonding heat treatment, the COP elimination annealing which are peculiar to the wafer type can be used also as the heat treatment which can be effective in preventing the generation of the oxygen donor as described above.

Furthermore, in addition to the existing heat treatment which is peculiar to the wafer type, an exclusive treatment which is effective in preventing the generation of the oxygen donor is also effective. In addition, the heat treatment for forming the oxygen precipitate nucleus to generate the oxygen precipitate and also the heat treatment for growing the oxygen precipitate can be implemented exclusively or commonly.

The oxygen out-diffusion heat treatment is preferably performed at 1100 to 1350° C. for 1 to 5 hours. The oxygen is reduced in the wafer surface layer by the oxygen out-diffusion heat treatment and since the oxygen precipitate is prevented from being generated and grown, the DZ layer is formed. Furthermore, the oxygen donor is prevented from being generated.

The high-temperature oxidation heat treatment for forming the BOX layer in manufacturing the SIMOX wafer is normally performed at 1250 to 1400° C. for 1 to 20 hours. The heat treatment atmosphere in the treatment comprises oxygen gas, argon gas or mixture of these.

When the bonded wafer is manufactured, after a thermally oxidized film having a desired film thickness is formed on the surface of the support substrate, the oxidation treatment is performed at 1100° C. or higher in order to bond the support substrate and the active layer substrate. This heat treatment is also effective in preventing the generation of the oxygen donor.

According to the COP elimination annealing, the COP can be sufficiently eliminated in the heat treatment performed at 1100° C. or higher for 1 hour or more in a non-oxidizing gas atmosphere and the heat treatment can be used also as the heat treatment which is effective in preventing the generation of the oxygen donor. More specifically, as the heat treatment atmosphere, a hydrogen gas atmosphere, an argon gas atmosphere or an atmosphere of mixture of these gas is preferable, and the heat treatment is preferably performed at 1150 to 1200° C. for 1 to 5 hours. If the temperature is less than 1110° C. and the time is less than 1 hour, the oxygen donor is not sufficiently prevented from being generated. Meanwhile, if the temperature is beyond 1350° C., the slip dislocation is likely to be generated, so that the heat treatment is desirably performed within 5 hours in view of productivity.

In the IG treatment for providing the gettering ability, the heat treatment for generating the oxygen precipitate nucleus is preferably performed at relatively low temperature such as 550 to 950° C. for 1 to 16 hours, and the heat treatment for growing the oxygen precipitate is preferably performed at high temperature such as 900 to 1100° C. for 1 to 20 hours. The latter heat treatment for growing the oxygen precipitate is effective in preventing the generation of the oxygen donor.

As described above, in the high-resistance silicon wafer according to the present invention, while the generation of the oxygen thermal donor can be prevented by the carbon doping, the generation of the oxygen donor can be effectively prevented in many kinds of wafers by using various kinds of heat treatments which is peculiar to the wafer type without using any special operation. Therefore, the generation of the thermal donor and the new donor can be prevented only by carbon doping substantially. As a result, lowering of unstable resistivity because of the generation of the oxygen donor can be prevented with extremely economical efficiency.

BEST MODE FOR CARRYING OUT THE INVENTION

Hereinafter, first to fourth embodiments of the present invention will be described.

First Embodiment

DZ Wafer

As the first step, a high-oxygen, high-resistance and carbon-doped silicon single crystal is formed by a normal CZ method. As the second step, a primary substrate in which for example, an amount of oxygen is 10 to $18 \times 10^{17}$ atoms/$cm^3$, an amount of carbon is $5 \times 10^{15}$ to $5 \times 10^{17}$ atoms/$cm^3$ and resistance is high (100 Ωcm or more) is formed from the silicon single crystal.

As the third step, an OD treatment is performed on the primary substrate at 1100 to 1200° C. for 1 to 4 hours. By this OD treatment, an oxygen precipitate (BMD) is prevented from being generated in the vicinity of a wafer surface in the heat treatment as will be described below. Thus, a DZ (Denuded Zone) layer is formed at least 5 μm or more in depth from a surface of a product wafer.

The OD treatment can be performed in an atmosphere of a mixed gas of nitrogen gas and oxygen gas. In addition, it can be performed in a hydrogen gas atmosphere. Furthermore, it can be performed in argon gas atmosphere. Still in addition, it can be performed in an atmosphere of a mixed gas of hydrogen gas and argon gas.

As the fourth step, a heat treatment for forming a nucleus of the oxygen precipitate is performed on the primary substrate at 550 to 950° C. for 1 hour or more. It is performed at 700° C. or more preferably. Then, as a heat treatment for growing the oxygen precipitate, a heat treatment is performed at 900 to 1100° C. for 1 hour or more.

By the heat treatment at the fourth step, the oxygen precipitate (BMD) is formed at a density of $1 \times 10^4$ pieces/$cm^2$ or more in a silicon wafer having high resistance of 100 Ωcm or more. Thus, the oxygen concentration in the wafer is reduced, for example, to be not less than $6.5 \times 10^{17}$ atoms/$cm^3$ and not more than $16 \times 10^{17}$ atoms/$cm^3$.

The silicon wafer product as thus manufactured is shipped to a device manufacturer. The characteristics of the product are described below.

First, since a general-purpose silicon wafer having a relatively high oxygen concentration is used as the primary substrate, it is economically efficient. Secondly, since the oxygen precipitate is eliminated from the wafer surface layer, it is superior in device characteristics. Thirdly, since the large-sized oxygen precipitate (BMD) is formed in the wafer at a high density, it is superior in gettering ability. Fourthly, since a final oxygen concentration is relatively high and carbon is doped, it is superior in mechanical strength and slipping resistance. Fifthly, because of an inhibitory action of oxygen thermal donor by the doped carbon and an inhibitory action of oxygen donor by various kinds of high-temperature heat treatment in the wafer manufacturing process, although the final oxygen concentration is at a relatively high level, a resistance value is prevented from being varied unstably because of generation of the oxygen donor in a heat treatment for forming a circuit which is to be performed on the side of the device manufacturer.

In addition, when a hydrogen gas or an argon gas is selected as the atmosphere in the OD treatment, a grown-in defect can be reduced or vanished and a density of a LPD (Light Point Defect) having a size of 0.12 μm or more observed on the wafer surface can be reduced to 0.2 pieces/$cm^2$ or less.

Second Embodiment

Epitaxial Wafer

As the first step, a high-oxygen, high-resistance and carbon-doped silicon single crystal is formed by a normal CZ method. As the second step, a primary substrate in which for example, an amount of oxygen is 10 to $18 \times 10^{17}$ atoms/$cm^3$ or more, an amount of carbon is $5 \times 10^{15}$ to $5 \times 10^{17}$ atoms/$cm^3$ and resistance is high (100 Ωcm or more) is formed from the silicon single crystal.

As the third step, an OD treatment is performed on the primary substrate at 1100 to 1200° C. for 1 to 4 hours. As the fourth step, a heat treatment for forming an oxygen precipitate nucleus is performed under a condition of at 550 to 950° C. for 1 hour or more. As the fifth step, a heat treatment is performed at 900 to 1100° C. for 1 hour or more as a heat treatment for forming a nucleus of the oxygen precipitate and as a heat treatment for growing the oxygen precipitate.

As the sixth step, after a hydrogen baking process at about 1180° C. is performed on each substrate processed until the second step, processed until the third step, processed until the forth step, or processed until the fifth step, an epitaxial growth process for growing an epitaxial layer having a thickness 5 μm is performed at about 1130° C.

An epitaxial silicon wafer product as thus manufactured has the following characteristics.

In order to examine whether the oxygen donor such as thermal donor (TD) and new donor (ND) is prevented from being generated or not, a heat treatment for generating the thermal donor is performed at 400° C. for 2 hours and a heat treatment for generating the new donor is performed at 750° C. for 8 hours on the respective wafers. There is no oxygen donor formed in the wafer on which epitaxial layer is grown at any step.

Especially, according to the wafer on which the epitaxial layer is grown after the second step, it is most superior in cost and it is effective as an epitaxial silicon wafer in which resistivity is not varied by generation of the oxygen donor even through the heat treatment of the device process.

In addition, according to the wafer on which the epitaxial layer is grown after the third step, since oxygen on the surface of the substrate is dispersed outward, the BMD is not precipitated on the surface of the substrate during the epitaxial growing process or the heat treatment of the device process, so that it is effective as a high-definition epitaxial silicon wafer in which the generation of a defect due to the BMD precipitation does not offur in the epitaxial layer BMD is precipitated.

In addition, according to the wafer on which the epitaxial layer is grown in the fourth step, since the DZ layer is also formed and oxygen precipitate nucleus sufficiently exists in the wafer, when it is used in the device process including a heat treatment at high temperature for a long time, it can be expected that the oxygen precipitate is sufficiently grown by the heat treatment of the device process, so that it is effective as a epitaxial silicon wafer which is superior in a gettering ability.

Furthermore, according to the wafer on which the epitaxial layer is grown in the fifth step, since the DZ layer is also formed and the BMD has been already sufficiently grown, it is effective as a epitaxial silicon wafer which provides enough gettering ability from an initial stage of the device process.

Thus, according to each of the wafer on which the epitaxial layer is grown after each step, it is needless to say that variation in a resistance value because of generation of the oxygen donor in the heat treatment for forming the circuit which is to be performed on the side of the device manufacturer can be avoided.

Third Embodiment

SIMOX Wafer

As the first step, a high-oxygen, high-resistance and carbon-doped silicon single crystal is formed by a normal CZ method. As the second step, a primary substrate in which for example, an amount of oxygen is 10 to $18 \times 10^{17}$ atoms/$cm^3$ or more, an amount of carbon is $5 \times 10^{15}$ to $5 \times 10^{17}$ atoms/$cm^3$ and resistance is high (100 Ωcm or more) is formed from the silicon single crystal.

As the third step, oxygen ions are accelerated to 30 to 200 keV and ion injection is performed in a surface of the primary substrate at a density of about $10^{18}$ atoms/$cm^3$. As the fourth step, a heat treatment is performed on the substrate provided at the third step at 1250 to 1400° C. for 1 to 20 hours in an atmosphere of oxygen gas or argon gas or mixed oxygen and argon gas, to form a BOX layer (buried oxide film layer) in the substrate.

The SIMOX wafer product as thus manufactured has following characteristics.

Since a general-purpose silicon wafer having a relatively high oxygen concentration is used as a primary substrate, it is superior in economical efficiency. Since a final oxygen concentration is relatively high and carbon is doped, it is superior in mechanical strength and slipping resistance. Because of an inhibitory action of oxygen thermal donor by the doped carbon and an inhibitory action of oxygen donor by various kinds of high-temperature heat treatments in the wafer manufacturing process, although the final oxygen concentration is at a relatively high level, a resistance value is prevented from being varied unstably because of generation of the oxygen donor in the heat treatment for forming the circuit which is to be performed on the side of the device manufacturer.

Fourth Embodiment

Bonded Wafer

As the first step, a high-oxygen, high-resistance and carbon-doped silicon single crystal is formed by a normal CZ method. As the second step, a primary substrate in which for example, an amount of oxygen is 10 to $18 \times 10^{17}$ atoms/$cm^3$ or more, an amount of carbon is $5 \times 10^{15}$ to $5 \times 10^{17}$ atoms/$cm^3$ and resistance is high (100 Ωcm or more) is formed from the silicon single crystal.

As the third step, although it depends on a manufacturing method of a bonded SOI wafer, a heat treatment is performed at about 1000° C. in an atmosphere of oxygen in a series of wafer manufacturing steps and a thermally oxidized film serving as a BOX oxide film is formed on the surface of the primary substrate.

As the fourth step, the above primary substrate as a support substrate is bonded to another substrate serving as an active layer by heat treatment of about 1150° C. In addition, in a case a thick SOI wafer is manufactured, as another substrate serving as the active layer, a high-resistance silicon substrate which is doped with carbon may be used similar to the support substrate.

As the fifth step, the wafer on the side of the active layer is ground and etched to a thickness 0.5 μm.

The bonded SOI wafer product as thus manufactured has the following characteristics.

Since a general-purpose silicon wafer having a relatively high oxygen concentration is used as a primary substrate, it is superior in economical efficiency. Since a final oxygen concentration is relatively high and carbon is doped, it is superior in mechanical strength and slipping resistance. Because of an inhibitory action of oxygen thermal donor by the doped carbon and an inhibitory action of oxygen donor by various kinds of high-temperature heat treatments, although the final oxygen concentration is at a relatively high level, a resistance value is prevented from being varied unstably because of generation of the oxygen donor in the heat treatment for forming the circuit which is to be performed on the side of the device manufacturer.

Then, working examples of the present invention will be shown and compared with comparative examples to clarify the effect of the present invention.

FIRST WORKING EXAMPLE

The following two kinds of 8-inch sample wafers were cut out from a silicon single crystal grown by the CZ method. The first sample wafer is a P type carbon non-doped product in which resistivity is 1000 Ωcm and an oxygen concentration is $5 \times 10^{17}$ atoms/$cm^3$. The second sample wafer is a P type carbon doped product in which resistivity is 1000 Ωcm, an oxygen concentration is $5 \times 10^{17}$ atoms/$cm^3$, and a carbon concentration is $1 \times 10^{16}$ atoms/$cm^3$.

A heat treatment for eliminating the oxygen donor (DK treatment) was performed on both wafers at 650° C. for 30 minutes and then the following three patterns of heat treatments were performed. According to the first pattern, only an OD treatment was performed at 1150° C. for 3.5 hours in a nitrogen atmosphere containing 3% of oxygen. According to the second pattern, after the OD treatment, an isothermal heat treatment was performed at 700° C. for 1 to 8 hours or 750° C. for 2 to 16 hours in the nitrogen atmosphere containing 3% of oxygen as a heat treatment for forming oxygen precipitate nucleus. According to the third pattern, after the isothermal heat treatment, a high-temperature heat treatment was further performed at 1000° C. for 16 hours in the nitrogen atmosphere as a heat treatment for growing the oxygen precipitate.

Figure 2:
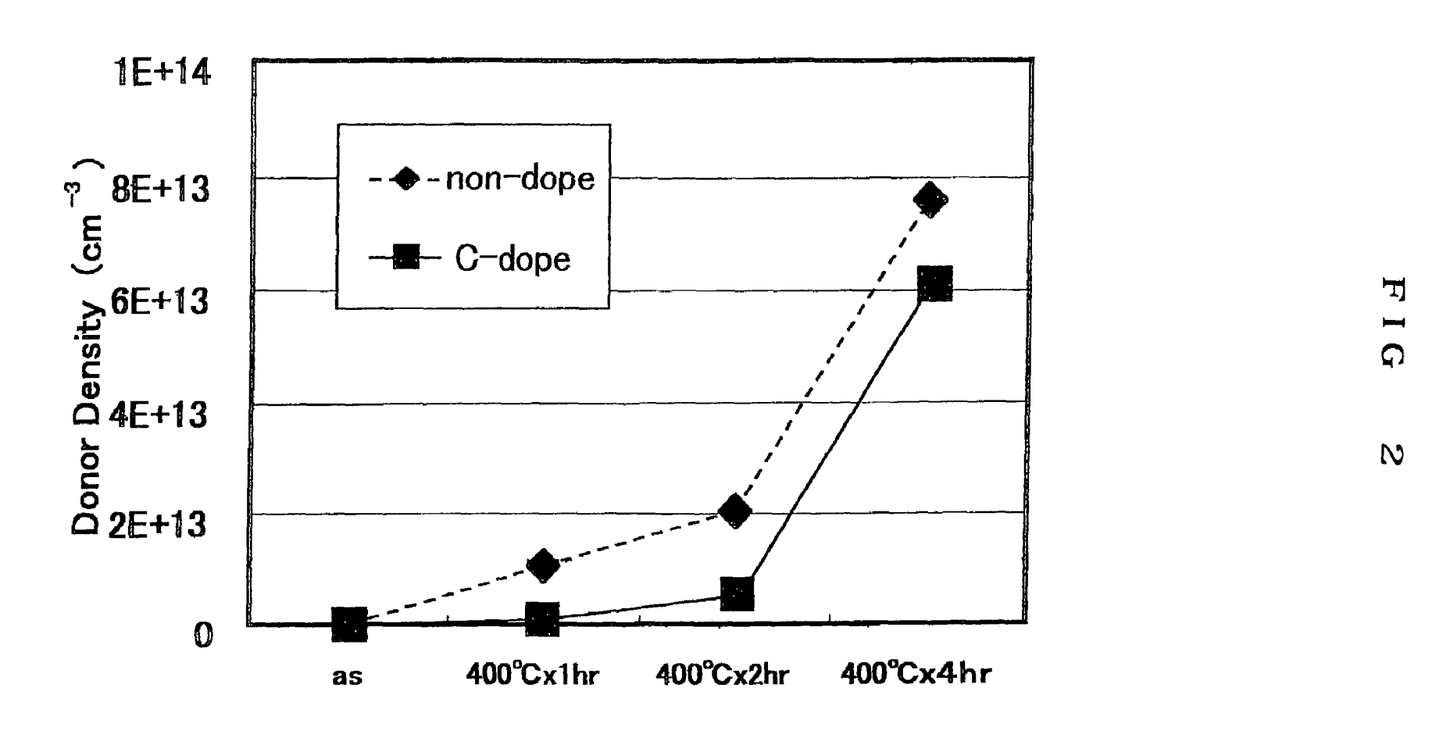
FIG. 2 is a graph showing an influence of carbon doping on generation of the oxygen donor.

Then, a heat treatment for generating a thermal donor was performed on the carbon non-doped wafer and the carbon doped wafer on which the DK treatment was performed (subsequent heat treatment was not performed) at 400° C. for 1 to 4 hours in the nitrogen atmosphere. After the heat treatment, an oxygen donor density was measured in such a manner that resistivity was measured by using a 4-probe method and an amount of oxygen donor was found from a difference between the resistivities after the DK treatment. The result is shown in FIG. 2. It is shown that the oxygen donor is prevented from being generated by the carbon doping only. Especially, until the treatment at 400° C. for 2 hours, the oxygen donor is prevented from being generated on the carbon doped wafer as compared with the carbon non-doped wafer.

Figure 3:
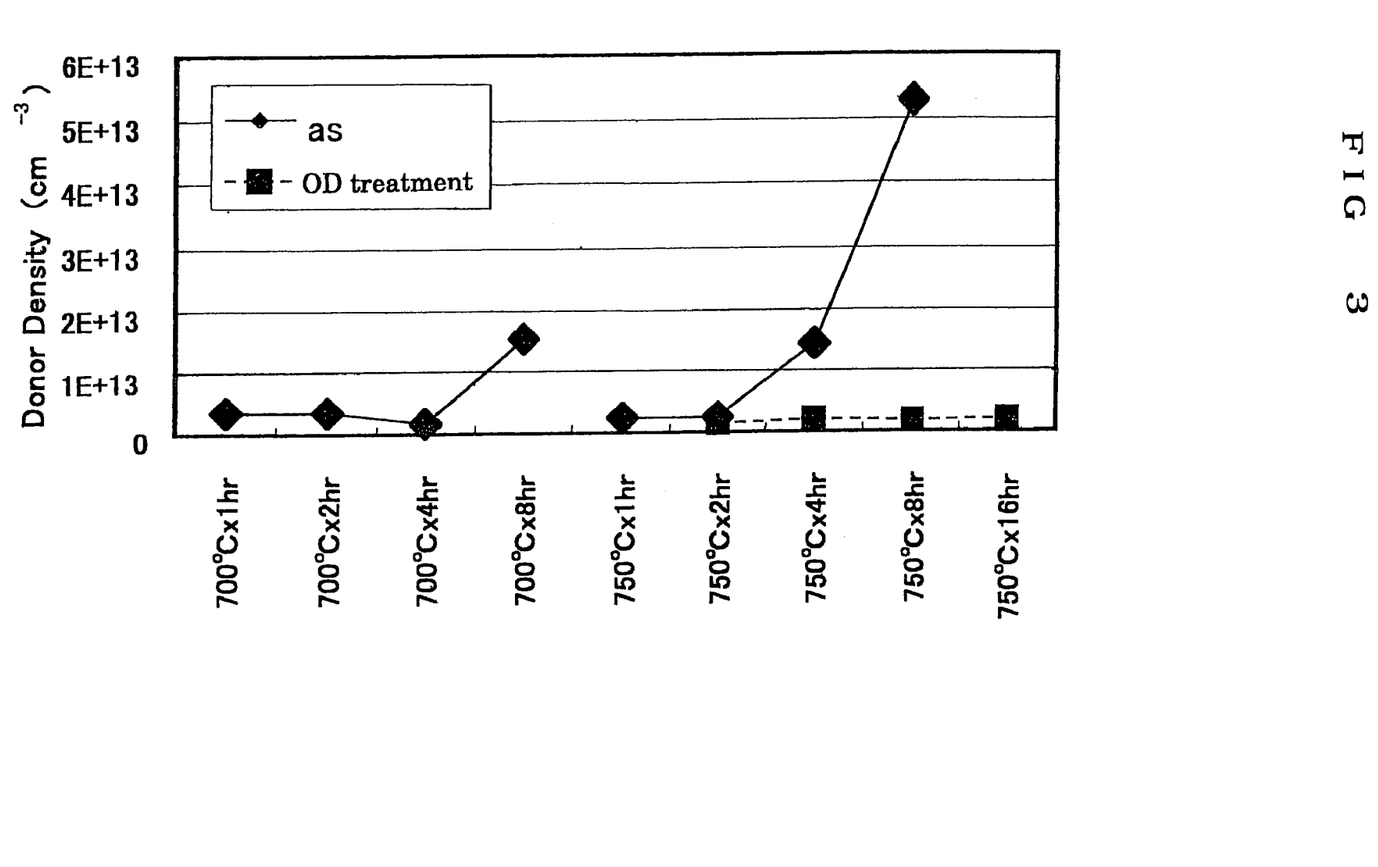
FIG. 3 is a graph showing an influence of a heat treatment on generation of the oxygen donor in a carbon doped product.

The result after the second pattern of heat treatment was performed on the carbon doped wafer is shown in FIG. 3. The isothermal heat treatment at 700° C. for 1 to 8 hours or at 750° C. for 2 to 16 hours is the heat treatment for forming the oxygen precipitate nucleus, and also the heat treatment for generating a new donor. When the OD treatment at 1150° C. for 3.5 hours is performed, the oxygen donor is prevented from being generated after the isothermal heat treatment.

After each heat treatment of the first, second and third patterns was performed on the carbon doped wafer, a heat treatment for generating the thermal donor was performed on each wafer at 400° C. for 1 to 4 hours in the nitrogen atmosphere. The result from measurement of an oxygen donor density after the heat treatment for generating the thermal donor was shown in FIG. 4(a) to 4(c).

Figure 4:
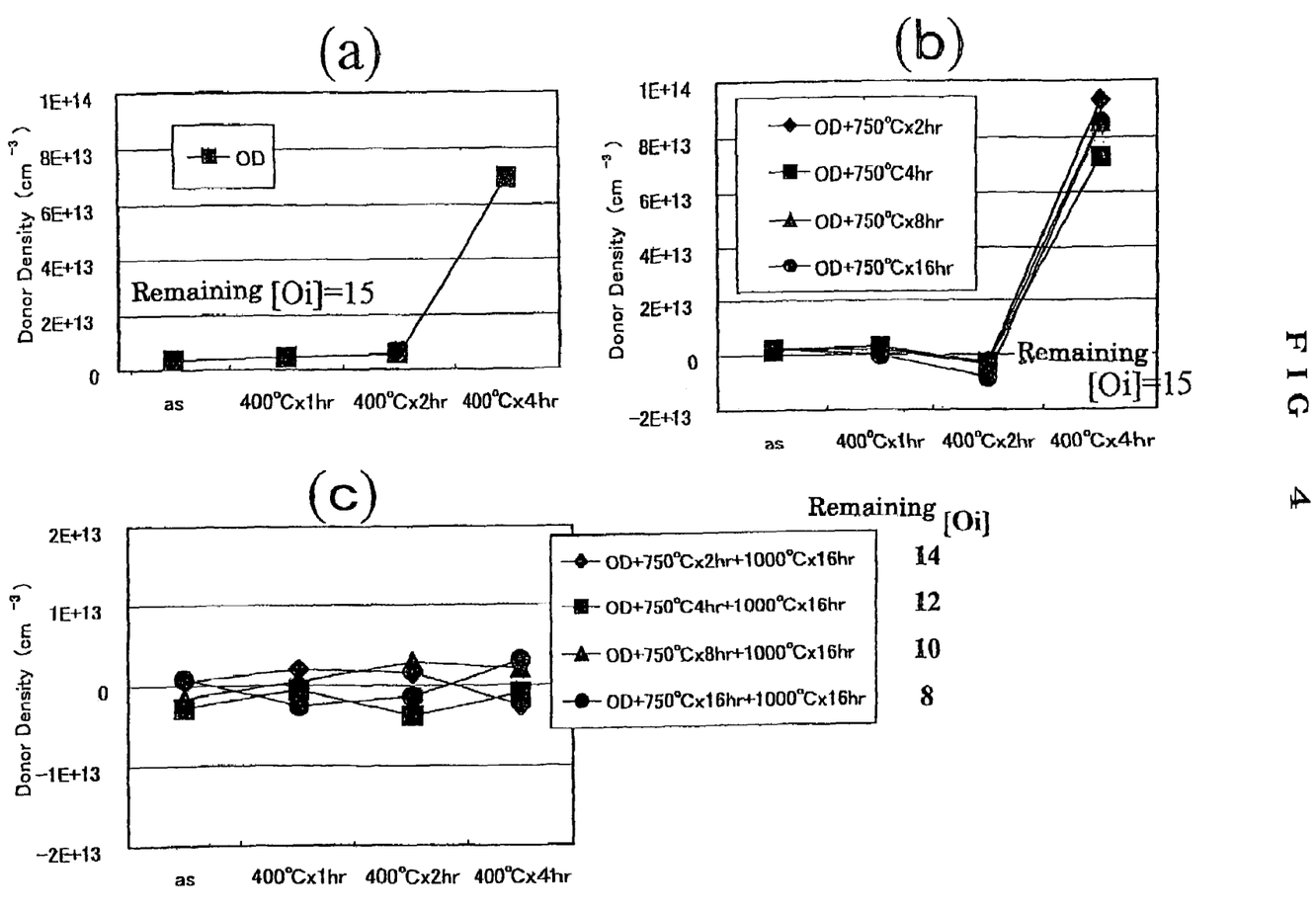
FIG. 4(a) to 4(c) are graphs each showing an influence of the kind of heat treatments on the generation of the oxygen donor in a carbon doped product.

As can be seen from comparison between FIG. 4(a) or 4(b) and FIG. 2, the oxygen donor is more prevented from being generated until the heat treatment at 400° C. for 2 hours by the OD treatment at 1150° C. for 3.5 hours or the subsequent heat treatment for generating the oxygen precipitate nucleus at 750° C. As shown in FIG. 4(c), the high-temperature heat treatment at 1000° C. for 16 hours as the heat treatment for growing the oxygen precipitate is more effective in preventing the oxygen donor generation and its effectiveness is not influenced by the remaining oxygen concentration.

Figure 5:
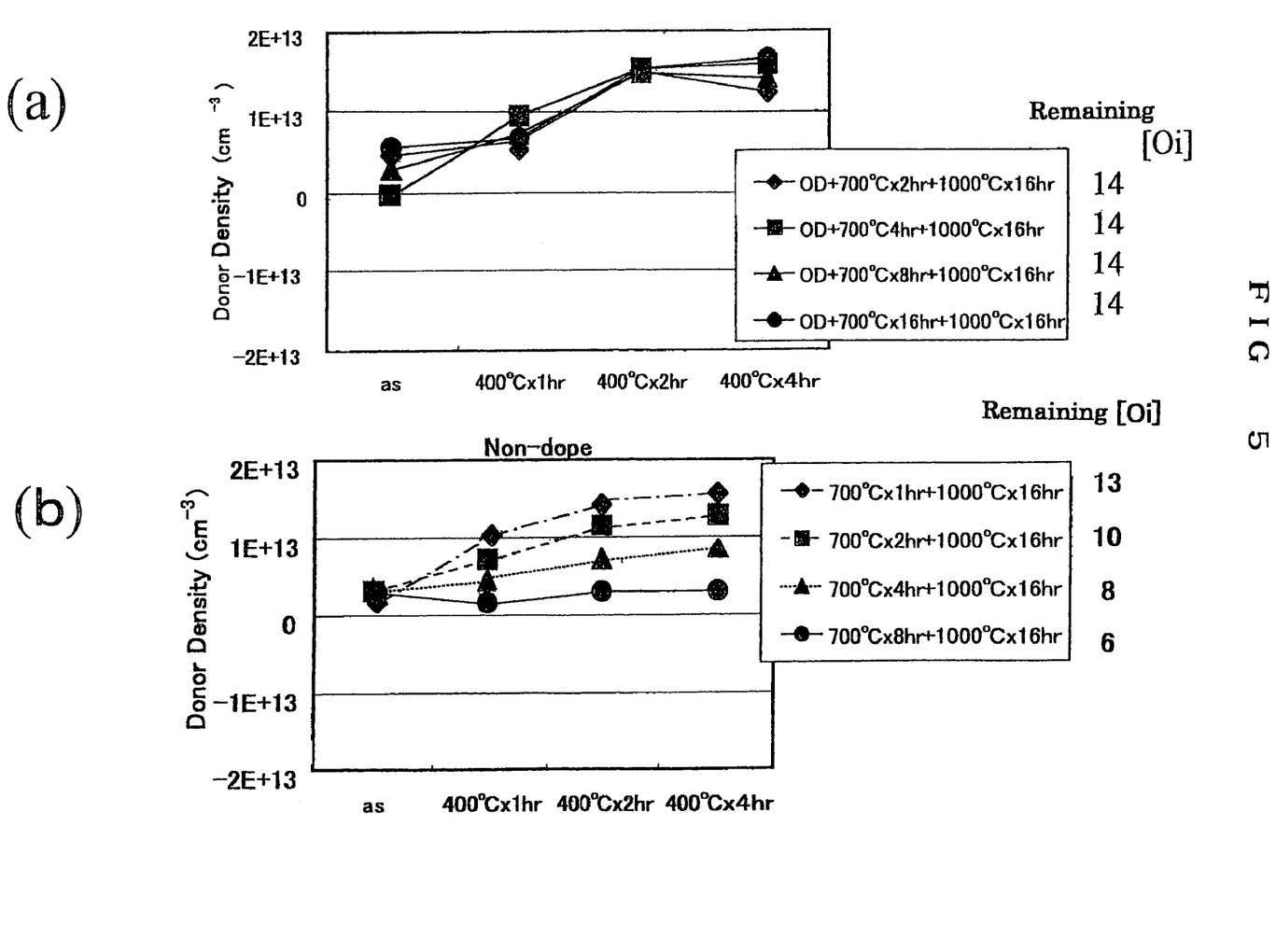
FIGS. 5(a) and 5(b) are graphs each showing an influence of a remaining oxygen concentration on the generation of the oxygen donor in a carbon non-doped product.

For reference, the result when the third heat treatment was performed on the carbon non-doped wafer is shown in FIG. 5(a) and 5(b). As shown in FIG. 5(a), when the OD treatment is performed, the remaining oxygen concentration is not sufficiently lowered even if the treatment time at the isothermal heat treatment is increased, and it is difficult to prevent the oxygen thermal donor from being generated. In addition, as shown in FIG. 5(b), when the OD treatment is not performed, the remaining oxygen concentration is lowered (the oxygen precipitate is increased) as the treatment time in the isothermal heat treatment is increased and accordingly the oxygen donor is prevented from being generated, but its effect is not so much as the effect provided by the carbon doping shown in FIG. 4(c). In addition, since the DZ layer is not provided by the heat treatment without the OD treatment, it cannot be applied to the device.

In order to provide the same effect as the effect by the carbon doping shown in FIG. 4(c) by generation of the oxygen precipitate in the heat treatment including the OD treatment, the OD treatment was performed on the carbon non-doped wafer having an initial oxygen concentration of $15 \times 10^{17}$ atoms/cm$^3$ and the heat treatments at 700° C. for 64 hours and at 1000° C. for 16 hours were performed. However, the remaining oxygen concentration is only lowered to $12 \times 10^{17}$ atoms/cm$^3$ and the oxygen thermal donor is not sufficiently prevented from being generated, so that a further long time unrealistic heat treatment is needed.

In the device process, a sintering heat treatment is performed at 400° C. or 350° C. for about 30 minutes after a wiring process of metal such as Al or Cu. This metal wiring is laminated to be several layers and the above described heat treatment is performed on each layer. Therefore, even when the heat treatment at 400° C. for about 2 hours is performed, it is necessary to maintain resistivity which is 100 Ωcm or more and preferably 1000 Ωcm or more. Since there is a measurement error in the 4-probe measurement, in the case of the p type after the DK treatment, a value lower than the resistance value is provided in some cases. Its variation is within $5 \times 10^{12}$ atoms/cm$^3$ in terms of a donor amount.

SECOND WORKING EXAMPLE

The following 5 kinds of 8-inch sample wafers were cut out from a silicon single crystal grown by the CZ method. The first sample wafer is a P type carbon non-doped product in which resistivity is 1000 Ωcm and an oxygen concentration is $15 \times 10^{17}$ atoms/cm$^3$. The second to fifth sample wafers are P type carbon doped products in which resistivity is 1000 Ωcm, an oxygen concentration is $15 \times 10^{17}$ atoms/cm$^3$, and a carbon concentration is $5 \times 10^{15}$, $1 \times 10^{16}$, $5 \times 10^{16}$, $1 \times 10^{17}$ atoms/cm$^3$.

A heat treatment for eliminating the oxygen donor (DK treatment) was performed on each of the above wafers at 650° C. for 30 minutes and then the OD treatment was performed at 1150° C. for 3.5 hours in a nitrogen atmosphere containing 3% of oxygen. Then, an isothermal heat treatment was performed in a nitrogen atmosphere containing 3% of oxygen as a heat treatment for forming oxygen precipitate nucleus at 700° C. for 8 hours on the carbon non-doped wafer and at 750° C. for 2 hours on the carbon doped wafer, and then, a high-temperature heat treatment was performed on these wafers in the nitrogen atmosphere as a heat treatment for growing the oxygen precipitate at 1000° C. for 16 hours.

A heat treatment for generating the oxygen thermal donor was performed at 400° C. for 4 hours in the nitrogen atmosphere on each of the DZ-IG processed wafer. An amount of oxygen donors was calculated from the result from measurement of resistivity of each wafer after the heat treatment. In case of the carbon doped wafer, variation in resistivity is small and the amount of oxygen donors is within an allowable range, meanwhile in the case of the carbon non-doped wafer, the oxygen donors are generated beyond the allowable value. As the result, it is found that the oxygen donor is effectively prevented from being generated when the carbon concentration is $5 \times 10^{15}$ atoms/cm$^3$ or more.

THIRD WORKING EXAMPLE

The following 2 kinds of 8-inch sample wafers were cut out from a silicon single crystal grown by the CZ method. The first sample wafer is a P type carbon non-doped product in which resistivity is 1000 Ωcm and an oxygen concentration is $15 \times 10^{17}$ atoms/cm$^3$. The second sample wafer is a P type carbon doped product in which resistivity is 1000 Ωcm, an oxygen concentration is $15 \times 10^{17}$ atoms/cm$^3$, and carbon concentration is $1 \times 10^{16}$ atoms/cm$^3$.

Figure 6:
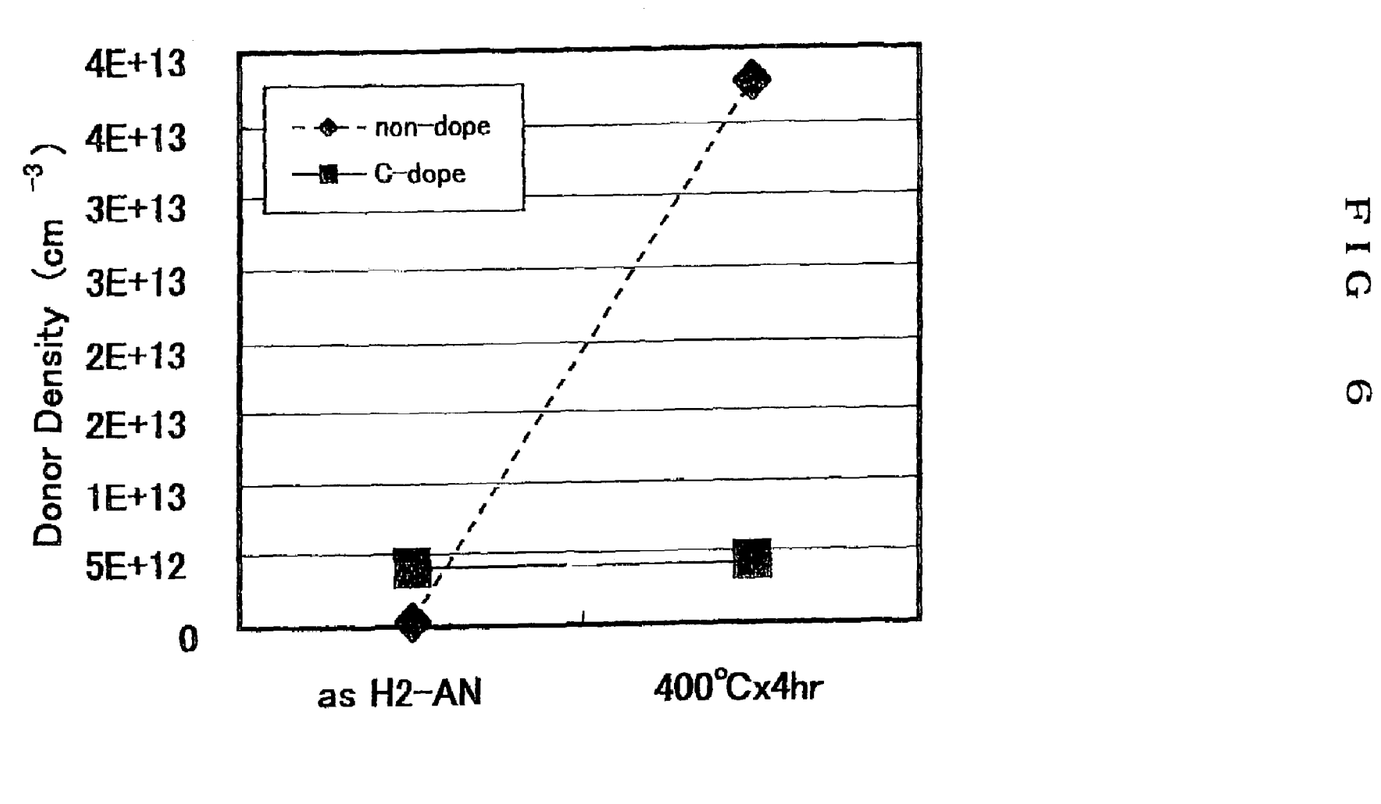
FIG. 6 is a graph showing an influence of hydro annealing on the generation of the oxygen donor in the carbon doped wafer and the carbon non-doped wafer.

These wafers were annealed with hydrogen in a hydrogen atmosphere at 1200° C. for 1 hour. An oxygen donor amount was found by measuring resistivity after the heat treatment for generating the thermal donor was performed at 400° C. for 4 hours in the nitrogen atmosphere just after the annealing. The result of oxygen donor amount thus obtained is shown in FIG. 6. The variation in resistivity is small and the amount of oxygen donor is not more than an allowable value in each wafer just after the annealing. Although the amount of oxygen donor generated in the carbon doped wafer is also not more than the allowable value after the heat treatment at 400° C. for 4 hours, the amount was not less than the allowable value in the case of the carbon non-doped wafer. As the result, it is found that the existing heat treatment of hydrogen annealing on the carbon doped wafer can serve also as the heat treatment which is effective in preventing the generation of the oxygen donor.

In addition, in order to find an effective temperature and a time of the hydrogen annealing, the carbon doped wafer was annealed with hydrogen at 800 to 1150° C. for 1 to 4 hours. Then, a heat treatment was performed at 1200° C. for 1 hour in an atmosphere of argon gas and an atmosphere of mixture gas of argon gas and hydrogen gas besides in the hydrogen gas atmosphere. The used wafers were both the second sample wafers. After the heat treatment, the heat treatment for generating the oxygen donor was performed on each wafer in the nitrogen atmosphere at 450° C. in which the oxygen donor is likely to be generated more than at 400° C., changing the time for 1 hour, 2 hours and 4 hours. The resistivity of each wafer after the heat treatment was measured and an amount of oxygen donor generated was found from the above result. The oxygen donor amount is shown in FIG. 7.

Figure 7:
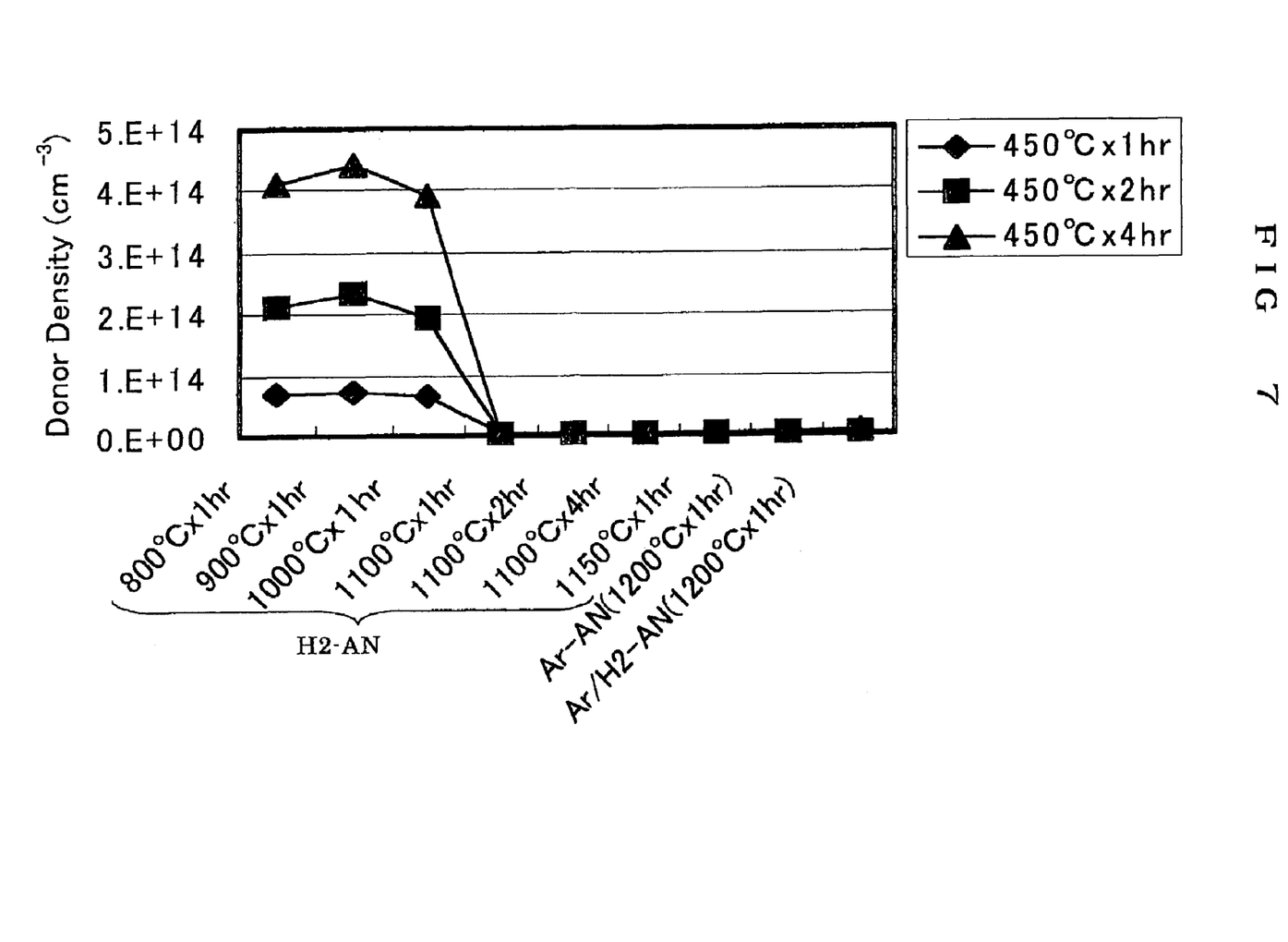
FIG. 7 is a graph showing an influence of a temperature and a time on the generation of the oxygen donor when various kinds of non-oxidizing gas are used in the heat treatment of the carbon doped product.

As can be clear from FIG. 7, although the oxygen donor was generated beyond the allowable value until the heat treatment at 1000° C. for 1 hour, the amount of oxygen donor generated was not more than the allowable value at 1100° C. or more for 1 hour or more. In addition, when the heat treatment was performed at 1200° C. for 1 hour in the argon gas atmosphere and in the atmosphere of the mixture gas of argon gas and hydrogen gas, the amount of oxygen donor generated is not more than the allowable value. That is, it is found that the oxygen donor can be effectively prevented from being generated when the heat treatment is performed at 1100° C. or more for 1 hour or more in a non-oxidizing gas atmosphere.

FOURTH WORKING EXAMPLE

A 8-inch wafer was cut out from a silicon single crystal grown by the CZ method. The wafer is a P type wafer in which resistivity is 2000 Ωcm, an oxygen concentration is $15 \times 10^{17}$ atoms/cm$^3$, and a carbon concentration is $1 \times 10^{16}$ atoms/cm$^3$.

The heat treatment for eliminating the oxygen donor (DK treatment) was performed on the wafer at 650° C. for 30 minutes and then the following heat treatment was performed. First, the OD treatment was performed at 1150° C. for 3.5 hours in the nitrogen atmosphere containing 3% of oxygen, and then the heat treatment for forming the oxygen precipitate nucleus was performed at 750° C. for 2 hours in the similar atmosphere. Then, epitaxial growing treatment was performed on the wafer so as to provide a P type layer having resistivity 10 Ωcm and a thickness 5 μm.

Even when the heat treatment for generating the thermal donor was performed at 400° C. for 2 hours and the heat treatment for generating the new donor was performed at 750° C. for 8 hours on this epitaxial wafer, the resistivity of the substrate is maintained at 2000 Ωcm or more which is the same as that after the DK treatment.

FIFTH WORKING EXAMPLE

The following 2 kinds of 8-inch sample wafers were cut out from a silicon single crystal grown by the CZ method. The first sample wafer is a P type carbon non-doped product in which resistivity is 1000 Ωcm and an oxygen concentration is $15 \times 10^{17}$ atoms/cm$^3$. The second sample wafer is a P type carbon doped product in which resistivity is 1000 Ωcm, an oxygen concentration is $15 \times 10^{17}$ atoms/cm$^3$, and a carbon concentration is $1 \times 10^{16}$ atoms/cm$^3$.

After the heat treatment for eliminating the oxygen donor (DK treatment) was performed on both wafer at 650° C. for 30 minutes, oxygen ions were sputtered into the surface at an acceleration voltage 100 keV. Then, the substrate was put in a heat treatment furnace which is maintained at 700° C. Then, the furnace was heated up to 1320° C. and kept for 10 hours. Then, the substrate was cooled down at 700° C. and taken out of the furnace, whereby an SIMOX wafer was manufactured.

Figure 8:
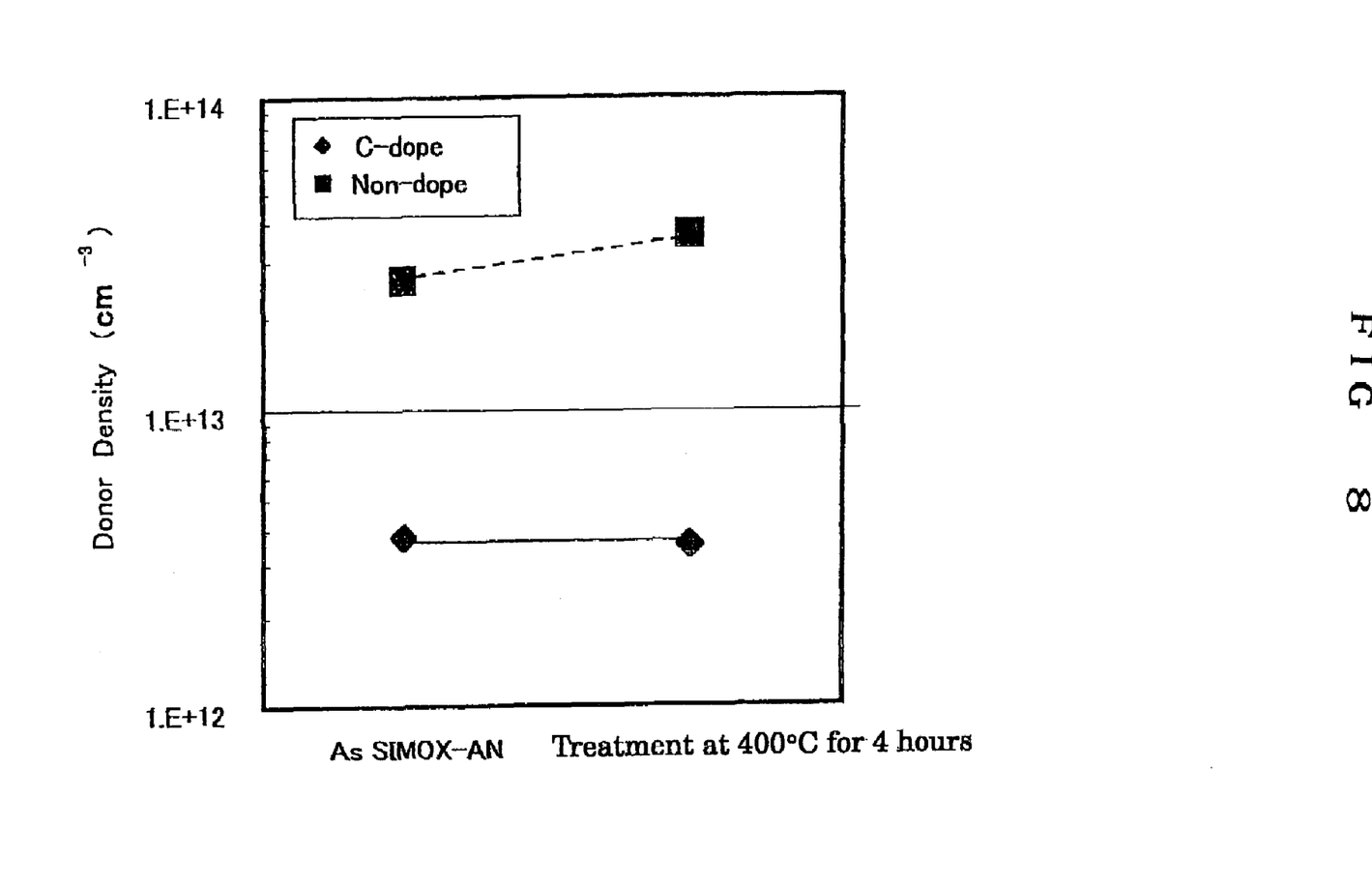
FIG. 8 is a graph showing an influence of a high-temperature heat treatment for forming a BOX layer in a manufacturing process of a SIMOX wafer on the generation of the oxygen donor in the carbon doped wafer and the carbon non-doped wafer.

The heat treatment for generating the thermal donor was performed at 400° C. for 4 hours in the nitrogen atmosphere on the SIMOX wafers which was manufactured from the carbon doped wafer and the carbon non-doped wafer. The result from the measurement of the oxygen donor density after the heat treatment for generating the thermal donor is shown in FIG. 8. As shown in FIG. 8, the oxygen donor is prevented from being generated in the carbon-doped SIMOX wafer. Meanwhile, although the generation of the oxygen donor is prevented a little in the carbon non-doped SIMOX wafer, its effect is not so much as the effect in the carbon-doped SIMOX wafer.

SIXTH WORKING EXAMPLE

The following 2 kinds of 8-inch sample wafers were cut out from a silicon single crystal grown by the CZ method. The first sample wafer is a P type carbon non-doped product in which resistivity is 1000 Ωcm and an oxygen concentration is $15 \times 10^{17}$ atoms/cm$^3$. The second sample wafer is a P type carbon doped product in which resistivity is 1000 Ωcm, an oxygen concentration is $15 \times 10^{17}$ atoms/cm$^3$, and a carbon concentration is $1 \times 10^{16}$ atoms/cm$^3$.

After the heat treatment for eliminating the oxygen donor (DK treatment) was performed on each wafer at 650° C. for 30 minutes, the heat treatment was performed on each wafer at 1000° C. in the oxygen atmosphere to form the thermally oxidized film on the surface of the primary substrate. Then, this substrate serving as a support substrate was bonded to another wafer serving as an active layer at 1150° C. Then, the wafer on the side of the active layer was ground and etched to a thickness 0.5 μm, whereby a bonded SOI wafer was manufactured.

The heat treatment for generating the thermal donor was performed at 400° C. for 4 hours in the nitrogen atmosphere on the bonded SOI wafers which were manufactured with the carbon doped wafer and the carbon non-doped wafer. An oxygen donor density was measured after the heat treatment for generating the thermal donor. Resistivity of the bonded carbon-doped wafer was small in variation from the resistivity after the DK treatment and generation of the oxygen donor was prevented within an allowable range. Meanwhile, according to the bonded carbon non-doped wafer, although the generation of the oxygen donor was prevented a little, its effect was not so much as that in the bonded carbon doped wafer.

INDUSTRIAL APPLICABILITY

As described above, according to the high-resistance silicon wafer of the present invention, generation of the oxygen donor can be prevented in the heat treatment for forming circuits which is to be performed on the side of the device manufacturer by carbon doping without lowering a remaining oxygen concentration. Thus, the mechanical strength of the wafer can be maintained and heat treatment costs can be lowered. Furthermore, since an appropriate amount of oxygen precipitate is generated without being influenced by the remaining oxygen concentration, an excellent gettering ability can be provided.

In addition, according to the manufacturing method of high-resistance silicon wafer of the present invention, the generation of the oxygen donor can be effectively prevented by performing the heat treatment which is effective in preventing the generation of the oxygen donor in addition to the carbon doping. Furthermore, since various kinds of heat treatments which are peculiar to a wafer type can be used as the above heat treatment, an increase in heat treatment costs can be avoided and excellent economical efficiency is provided.

The invention claimed is:

1. A high-resistance silicon wafer having resistivity of 100 Ωcm or more, wherein a carbon concentration is $5 \times 10^{15}$ atoms/cm$^3$, and wherein an oxygen concentration is over $8 \times 10^{17}$ atoms/cm$^3$ (Old-ASTM).

2. The high-resistance silicon wafer according to claim 1, wherein a DZ (Denuded Zone) layer is formed at least 5 μm or more in depth from a surface of the wafer.

3. The high-resistance silicon wafer according to claim 1, wherein a density of a LPD (Light Point Defect) having a size of 0.12 or more and observed on a surface of the wafter is controlled so as to be 02/cm$^2$ or less.

4. An epitaxial wafer having a high-resistance silicon wafer according to claim 1 as a base wafer.

5. An SOI having a high-resistance silicon wafer according to claim 1 as a base wafer.

6. The SOI wafer according to claim 5, which is a bonded wafer or SIMOX wafer.

7. A method of manufacturing a high-resistance silicon wafer, wherein a heat treatment which is effective in preventing an oxygen donor from being generated is performed on a silicon wafer having a resistivity of 100 Ωcm or more and a carbon concentration of $5 \times 10^{15}$ to $5 \times 10^{17}$ atoms/cm$^3$, so that a remaining oxygen concentration is said wafer after the heat treatment is $6.5 \times 10^{14}$ atoms/cm$^3$ (Old-ASTM) or more.

8. The method of manufacturing a high-resistance silicon wafer according to claim 7, wherein the heat treatment is a high-temperature heat treatment at 1100° C. or higher.

9. The method for manufacturing a high-resistance silicon wafer according to claim 7, wherein the heat treatment is an oxygen out-diffusion treatment for forming a DZ (Denuated Zone) layer on a wafer surface.

10. The method of manufacturing a high-resistance silicon wafer according to claim 9, wherein after the oxygen out-diffusion treatment a heat treatment for forming an oxygen precipitate nucleus, or the heat treatment for forming the oxygen precipitate nucleus and a heat treatment for growing an oxygen precipitate are performed.

11. The method of manufacturing a high-resistance silicon wafer according to claim 7, wherein the heat treatment is high-temperature annealing treatment for eliminating a COP which is a void defect caused by a hole from a wafer surface.

12. A method of manufacturing an SOI wafer, comprising manufacturing an SIMOX type of SOI wafer that comprises a high-resistance silicon wafer having resistivity of 100 Ωcm or more and a carbon concentration of $5 \times 10^{15}$ to $5 \times 10^{17}$ atoms/cm$^3$, and an oxygen concentration of over $8 \times 10^{17}$ atoms/cm$^3$ (Old-ASTM) as a base wafer.

13. The method of manufacturing the SOI wafer according to claim 12, wherein the high-temperature heat treatment for forming a BOX layer in a SIMOX type of SOI wafer manufacturing process serves also as a heat treatment which is effective in preventing generation of an oxygen donor.

14. A method of manufacturing an SOI wafer, comprising manufacturing a bonded type of SOI wafer that comprises a high-resistance silicon wafer having resistivity of 100 Ωcm or more and a carbon concentration of $5 \times 10^{15}$ to $5 \times 10^{17}$ atoms/cm$^3$, and an oxygen concentration of over $8 \times 10^{17}$ atoms/cm$^3$ (Old-ASTM) as a base wafer.

15. The method of manufacturing the SOI wafer according to claim 14, wherein the high-temperature heat treatment performed in the bonded type of SOI wafer manufacturing process serves also as a heat treatment which is effective in preventing the generation of the oxygen donor.

* * * * *